US008179360B2

(12) United States Patent  
Chin

(10) Patent No.: US 8,179,360 B2  
(45) Date of Patent: May 15, 2012

(54) DISPLAY AND GATE DRIVER CIRCUIT THEREOF

(75) Inventor: Yin-Hsuan Chin, Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 371 days.

(21) Appl. No.: 12/685,663

(22) Filed: Jan. 11, 2010

(65) Prior Publication Data

US 2011/0102388 A1    May 5, 2011

(30) Foreign Application Priority Data

Nov. 2, 2009    (TW) ................................ 98137160 A

(51) Int. Cl.  
     *G09G 3/36*      (2006.01)  
(52) U.S. Cl. ........................... 345/100; 345/205; 377/64  
(58) Field of Classification Search ............ 345/98–100; 377/64–81  
See application file for complete search history.

(56) References Cited

U.S. PATENT DOCUMENTS

| | | | | |
|---|---|---|---|---|
| 6,590,816 B2* | 7/2003 | Perner | | 365/200 |
| 7,016,242 B2* | 3/2006 | Nagata et al. | | 365/200 |
| 7,237,155 B2* | 6/2007 | Wheeler | | 714/718 |
| 7,256,760 B2* | 8/2007 | Yamazaki et al. | | 345/98 |
| 7,627,796 B2* | 12/2009 | Wheeler | | 714/724 |
| 7,889,831 B2* | 2/2011 | Mnich | | 377/54 |
| 2006/0274021 A1* | 12/2006 | Park et al. | | 345/100 |
| 2007/0040794 A1* | 2/2007 | Kwak et al. | | 345/100 |
| 2007/0085809 A1* | 4/2007 | Wei et al. | | 345/100 |
| 2007/0132700 A1* | 6/2007 | Cho et al. | | 345/100 |
| 2007/0164972 A1* | 7/2007 | Chang | | 345/100 |
| 2007/0195030 A1* | 8/2007 | Huang et al. | | 345/87 |
| 2007/0205974 A1* | 9/2007 | Iizuka et al. | | 345/98 |
| 2007/0216634 A1* | 9/2007 | Kim et al. | | 345/100 |

* cited by examiner

*Primary Examiner* — Alexander Eisen  
*Assistant Examiner* — Sanjiv D Patel  
(74) *Attorney, Agent, or Firm* — Jianq Chyun IP Office

(57) ABSTRACT

A gate driving circuit including M shift registers, a detecting unit, a control unit, a repair starting unit, a signal repairing device, and a signal replacing unit is provided, wherein M is a positive integer. The shift registers sequentially shift a starting signal according to a plurality of clock signals to generate M gate driving signals. The detecting unit detects the gate driving signals. The control unit generates a first and a second auxiliary signals, wherein the first and the second auxiliary signals are synchronous with two gate driving signals which are before and after a specific driving signal. The signal repairing device is enabled according to a valid repair starting signal outputted by the repair starting unit to generate a repairing signal according to the first auxiliary signal. The signal replacing unit replaces the specific driving signal with the repairing signal according to the clock signals.

12 Claims, 3 Drawing Sheets

DISPLAY AND GATE DRIVER CIRCUIT THEREOF

CROSS-REFERENCE TO RELATED APPLICATION

This application claims the priority benefit of Taiwan application serial no. 98137160, filed on Nov. 2, 2009. The entirety of the above-mentioned patent application is hereby incorporated by reference herein and made a part of specification.

BACKGROUND OF THE INVENTION

1. Field of the Invention

The invention generally relates to a display and a gate driving circuit thereof, and more particularly to a liquid crystal display (LCD) and a gate driving circuit thereof.

2. Description of Related Art

In recent years, in order to reducing the fabrication cost of the LCD, a part of manufacturers have directly fabricated the multiple stage shift register on the glass substrate by using the thin film transistor to replace the conventional gate driving chip in the related art. Accordingly, the fabrication cost of the LCD is reduced.

FIG. 1 is a schematic block diagram of a plurality of shift registers directly fabricated on the glass substrate in the related art. Referring to FIG. 1, the plurality of shift registers 110_1~110_S are coupled to each other in series, and sequentially shift a starting signal STV1 according to a plurality of clock signals CLK11~CLK14 to generate a plurality of gate driving signals SGI_1~SGI_S to drive scan lines 120_1~120_S in the display panel. In practice, the shift register 110_2 is set according to the gate driving signal SGI_1 generated by the previous shift register 110_1, and generates the gate driving signal SGI_2 according to the clock signal CLK12. Moreover, the shift register 110_2 stops operating when receiving the gate driving signal SGI_3 outputted by the next shift register 110_3. Similarly, the other shift registers 110_3~110_S have the operations similar to that of the shift register 110_2.

Furthermore, when the third shift register 110_3 is damaged, it can not generate a valid gate driving signal SGI_3, so that the shift registers 110_4~110_S after the third shift register 110_3 can not work normally. In order to avoid the shift registers 110_1~110_S unable to work normally due to a single damaged shift register, an auxiliary shift register 130 is added to the shift registers 110_1~110_S coupled in series in the related art, and the auxiliary shift register 130 is used to replace the damaged shift register 110_3.

It should be noted that, the shift registers 110_1~110_S coupled in series are repaired by laser fusing in the related art. Accordingly, when repairing the shift registers, as shown in FIG. 2, the operator needs to cut the clock end and the output end of the shift register 110_3 by laser cutting first, e.g. the cut points P11 and P12 marked in FIG. 2. Next, the operator welds the signal ends related to the shift register 110_3 to the auxiliary shift register 130, e.g. the welding points P13~P16 marked in FIG. 2. However, in such a way, it spends a lot of human resource, and it is also limited to the production in processing. Furthermore, it also wastes the hardware space of the production because a plurality of auxiliary shift registers is need to simultaneously repair the plurality of damaged shift registers in the related art.

SUMMARY OF THE INVENTION

An embodiment of the invention provides a gate driving circuit having the capability of automatically repairing the invalid gate driving signal.

An embodiment of the invention provides a display. It is not required for the display to go back to the original manufacturer for reparation because the shift register is damaged, thereby saving the labor cost and effectively increasing the lifespan of the display.

An embodiment of the invention provides a gate driving circuit including M shift registers, a detecting unit, a control unit, a repair starting unit, a signal repairing device, and a signal replacing unit, wherein M is a positive integer. Herein, M shift registers sequentially shifts a starting signal to generate M gate driving signals according to a plurality of clock signals. The detecting unit feeds a detecting voltage back to the control unit when one specific driving signal among the gate driving signals is invalid. The control unit accumulates a counter value according to the starting signal and the clock signals, and generates a set signal when receiving the detecting voltage having the specific level.

Moreover, the control unit further generates a first auxiliary signal and a second auxiliary signal according to the counter value, wherein the first auxiliary signal and the second auxiliary signal are synchronous with two gate driving signals which are before and after the specific driving signal The repair starting unit sets a repair starting signal to be valid when receiving the set signal. The signal repairing device is set according to the valid repair starting signal, and the signal repairing device is set according to the first auxiliary signal to generate a repairing signal. Furthermore, the signal repairing device stops operating according to the second auxiliary signal. The signal replacing unit replaces the one of the gate driving signals with the repairing signal.

In an embodiment of the invention, the control unit includes a comparator and a microcontroller. The comparator compares the detecting voltage with a reference voltage, and generates a comparison signal according to the comparison result. The microcontroller determines whether to generate the set signal according to the comparison signal, and accumulates the counter value according to the starting signal and the clock signals. Moreover, the microcontroller further generates the reference voltage, and generates the first auxiliary signal and the second auxiliary signal according to the counter value.

Another embodiment of the invention provides a display including a display panel and the above-described gate driving circuit. The display panel includes a pixel array, and the pixel array is disposed on a substrate. Furthermore, the M shift registers, the detecting unit, the repair starting unit, the signal repairing device, and the signal replacing unit in the above-described gate driving circuit are all disposed on the substrate of the display panel.

In view of the above, by using the control unit, the first auxiliary signal and the second auxiliary signal which are respectively before and after the invalid gate driving signal are generated in an embodiment of the invention. Accordingly, the signal repairing device can generate the repairing signal configured to replace the invalid gate driving signal according to the first auxiliary signal and the second auxiliary signal. As a result, the gate driving circuit has the capability of automatically repairing the invalid gate driving signal in an embodiment of the invention. On the contrary, compared with the related art, it is not required for the display in an embodiment of the invention to go back to the original manufacturer for reparation because the shift register is damaged, thereby saving the labor cost and effectively increasing the lifespan of the display.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
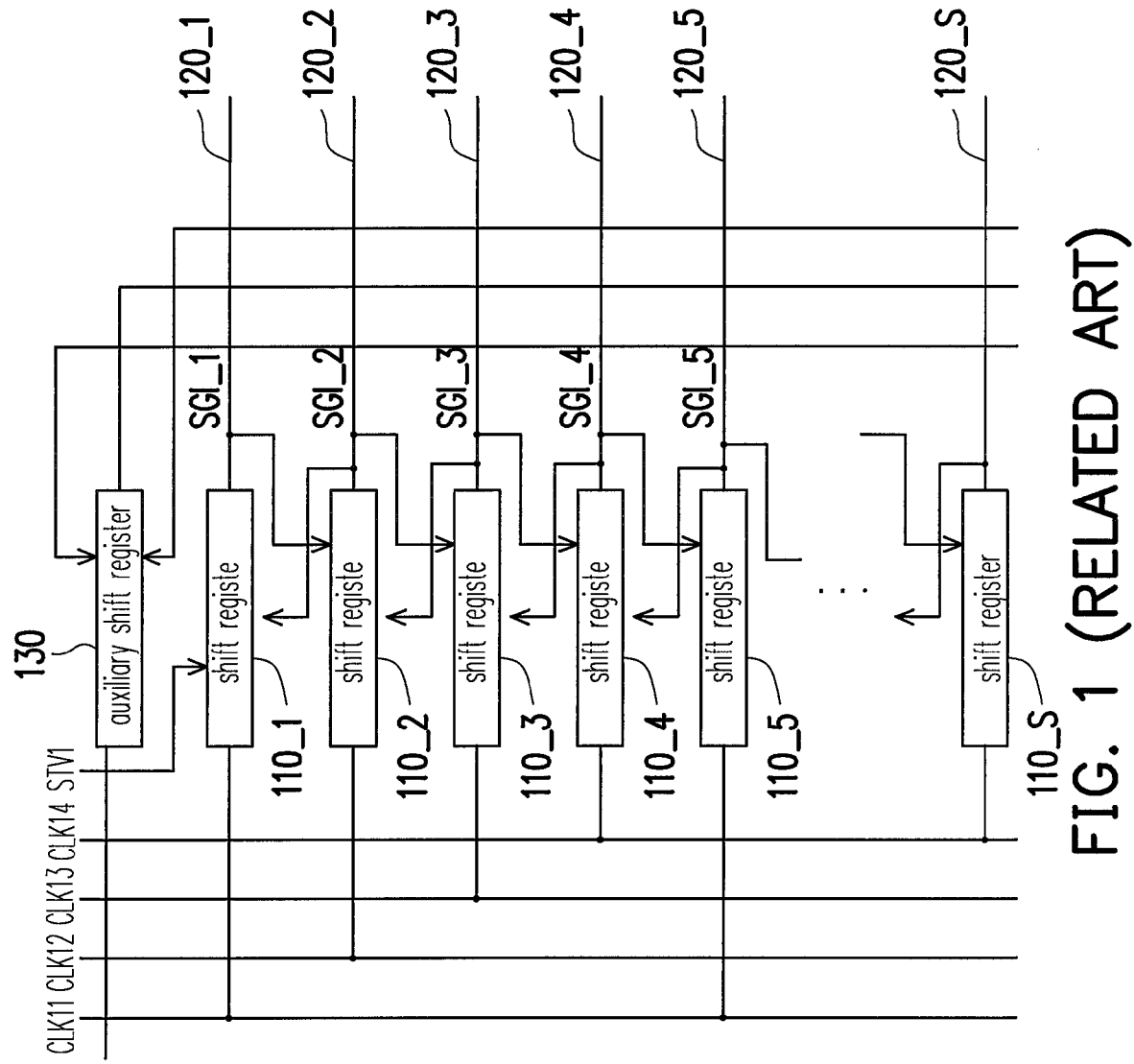
FIG. 1 is a schematic block diagram of a plurality of shift registers directly fabricated on the glass substrate in the related art.
Figure 2:
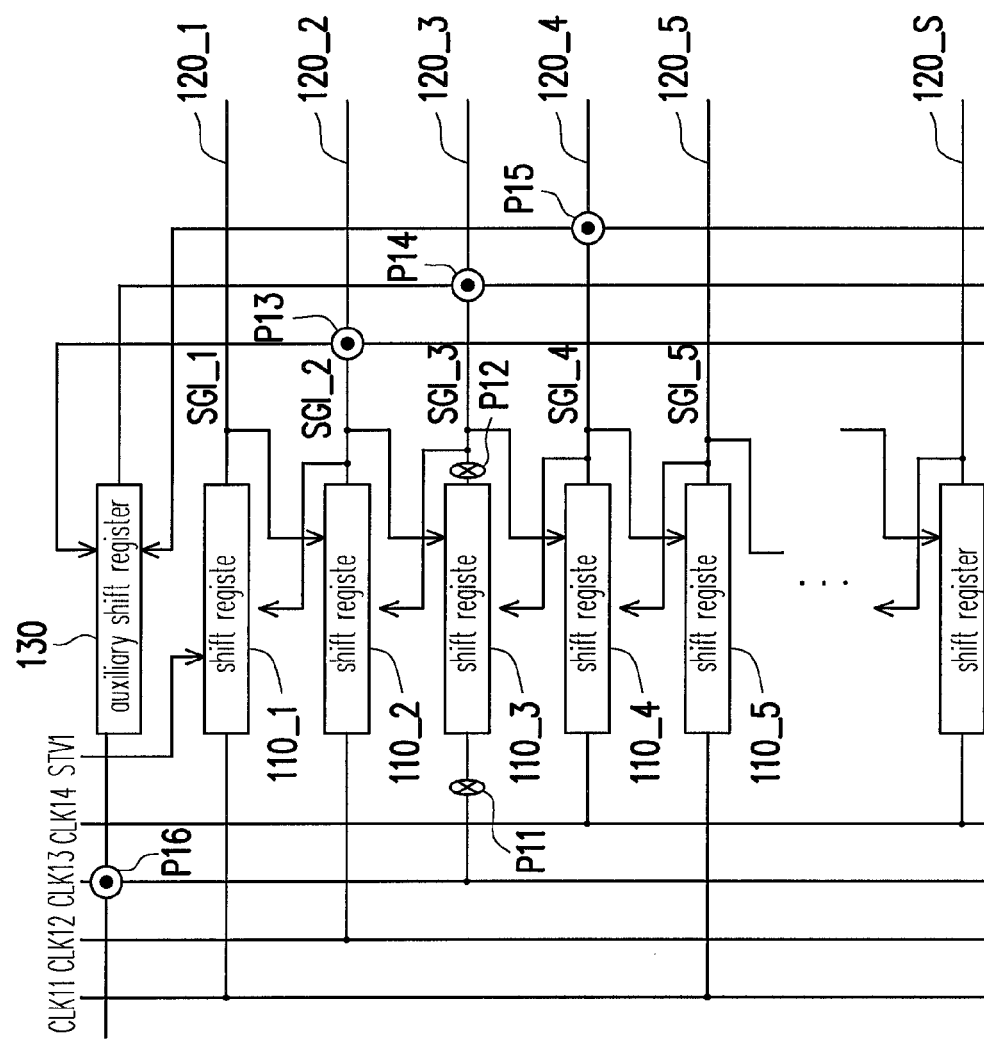
FIG. 2 is a schematic diagram of repairing the shift register.
Figure 3:
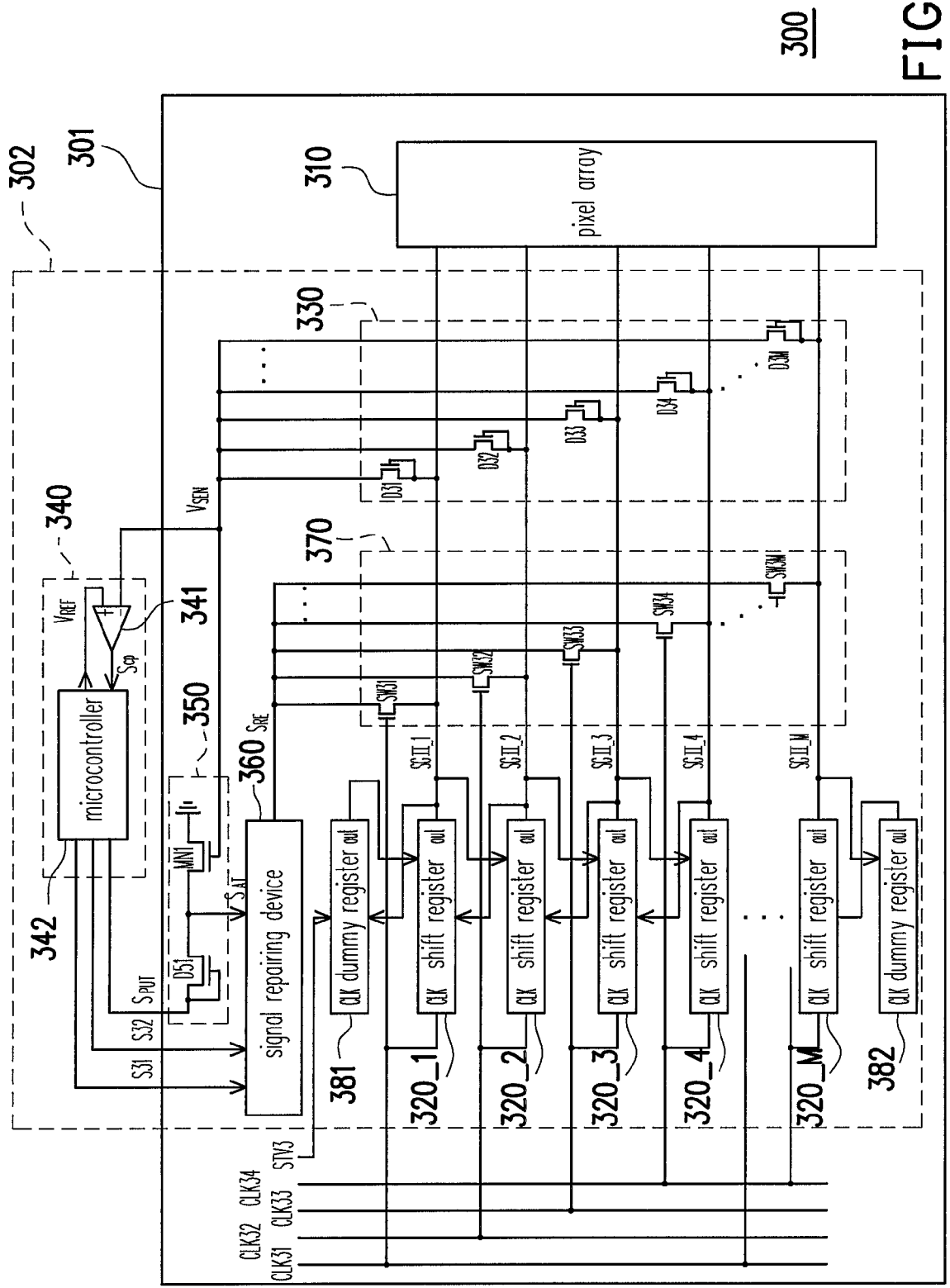
FIG. 3 is a schematic block diagram of a display according to an embodiment of the invention.

FIG. 3 is a schematic block diagram of a display according to an embodiment of the invention. Referring to FIG. 3, the display 300 includes a display panel 301 and a gate driving circuit 302. Herein, the display panel 301 includes a pixel array 310. The gate driving circuit 302 includes M shift registers 320_1~320_M, a detecting unit 330, a control unit 340, a repair starting unit 350, a signal repairing device 360, and a signal replacing unit 370, wherein M is a positive integer. For the entire configuration, the pixel array 310 is disposed on a substrate, and the shift registers 320_1~320_M, the detecting unit 330, the repair starting unit 350, the signal repairing device 360, and the signal replacing unit 370 in the gate driving circuit 302 are all disposed on the substrate. In other words, except for the control unit 340, the above-described elements in the gate driving circuit 302 are all disposed inside the display panel 301.

Referring to FIG. 3, the shift registers 320_1~320_M are electrically connected to each other. Furthermore, in order to prevent the effect due to the electrostatic discharge, the dummy registers 381 and 382 can be further connected to the shift registers 320_1 and 320_M respectively, but it does not limit the invention. Accordingly, those ordinarily skilled in the art can decide whether to remove the dummy registers 381 and 382 based on design requirement. For the detail operation of the shift registers 320_1~320_M, each of the shift registers 320_1~320_M has a clock end clk and an output end out to receive the clock signals CLK31~CLK34 and output the gate driving signals SGII_1~SGII_M respectively. The number of the clock signals CLK31~CLK34 can be changed based on design requirement.

Herein, if the number of the clock signals CLK31~CLK34 required by the shift registers 320_1~320_M is four, and the starting signal STV3 is directly transmitted to the shift register 320_1, at start, the shift register 320_1 is set according to the starting signal STV3, and generates the gate driving signal SGII_1 according to the clock signal CLK31 received by the clock end clk thereof. Next, the gate driving signal SGII_1 is transmitted to the next shift register 320_2. Accordingly, the shift register 320_2 is set according to the gate driving signal SGII_1 generated by the previous shift register 320_1, and generates the gate driving signal SGII_2 according to the clock signal CLK32 received by the clock end clk thereof. Thereafter, the gate driving signal SGII_2 is returned to the previous shift register 320_1, so that the shift register 320_1 stops operating.

Similarly, the shift register 320_3 is set according to the gate driving signal SGII_2 generated by the previous shift register 320_2, and generates the gate driving signal SGII_3 according to the clock signal CLK33 received by the clock end clk thereof. Moreover, the shift register 320_3 stops operating further according to the gate driving signal SGII_4 generated by the next shift register 320_4. In such a way, the detail operation of the shift registers 320_4~320_M can be obtained. Accordingly, the shift registers 320_1~320_M sequentially shifts the starting signal STV3 to generate M gate driving signals SGII_1~SGII_M according to the clock signals CLK31~CLK34.

In practice, the M gate driving signals SGII_1~SGII_M are M valid gate pluses to turn on the pixels in the pixel array respectively. However, when one of the shift registers is damaged, the damaged shift register can not generate the gate driving signal, so that the gate driving signal generated thereby is maintained at an invalid status. In order to avoid the invalid gate driving signal causing the gate driving circuit can not operate normally, the gate driving circuit 302 has the capability of automatically repairing the invalid gate driving signal in the present embodiment, and it will be described as follows.

Referring to FIG. 3, the detecting unit 330 detects the gate driving signals SGII_1~SGII_M outputted by the shift registers 320_1~320_M. Furthermore, the detecting unit 330 further switches a detecting voltage $V_{SEN}$ to a specific level when one specific driving signal among the gate driving signals SGII_1~SGII_M is invalid.

For example, the configuration of detecting unit 330 is constituted by thin film transistors, which operate as conductive devices similar to diodes. Accordingly, in the present embodiment, the detecting unit 330 includes M diodes D31~D3M. Herein, the diodes D31~D3M corresponds to the shift registers 320_1~320_M one by one. Herein, the anode ends of the diodes D31~D3M receive the gate driving signals SGII_1~SGII_M, and the cathode ends thereof are electrically to each other to generate the detecting voltage $V_{SEN}$. When the gate driving signal SGII_1 is valid, the valid gate pulse can turn on the diode D31, thereby maintaining the detecting voltage $V_{SEN}$ at a high level. Similarly, when the gate driving signal SGII_2 is valid, the valid gate pulse can turn on the diode D32, thereby maintaining the detecting voltage $V_{SEN}$ at the high level.

In such a way, if the gate driving signals SGII_1~SGII_M sequentially outputted by the shift registers 320_1~320_M are all valid during a frame period, the detecting voltage $V_{SEN}$ is maintained at the high level during all of the frame period. On the contrary, if the shift register 320_2 is damaged during a frame period, it can not output the valid gate driving signal SGII_2, so that the diode D32 outputs a low conductive level, thereby switching the detecting voltage $V_{SEN}$ to a low level. In other words, when one of the gate driving signals SGII_1~SGII_M (a specific driving signal) is invalid, the detecting voltage $V_{SEN}$ is switched to the low level, wherein the low level is the specific level defined in the present embodiment.

Furthermore, the detecting voltage $V_{SEN}$ outputted by the detecting unit 330 is respectively transmitted to the control unit 340 and the repair starting unit 350. For the control unit 340, the control unit 340 accumulates a counter value according to the starting signal STV3 and the clock signals CLK31~CLK34, and generates a set signal $S_{PUT}$ when receiving the detecting voltage $V_{SEN}$ having the specific level. Moreover, the control unit 340 further generates a first auxiliary signal and a second auxiliary signal according to the counter value. The first auxiliary signal and the second auxiliary signal are respectively synchronous with two gate driving signals which are before and after the specific driving signal.

For example, the control unit 340 includes a comparator 341 and a microcontroller 342. The first input end of the comparator 341 receives a reference voltage $V_{REF}$, and the second input end of the comparator 341 receives the detecting voltage $V_{SEN}$, wherein the reference voltage $V_{REF}$ is provided by the microcontroller 342. Herein, if the specific level is set as the low level, the comparison signal $S_{CP}$ generated by the comparator 341 is switched to the low level when the comparator 341 receives the detecting voltage $V_{SEN}$ having the specific level. In other words, when one of the gate driving signals SGII_1~SGII_M (the specific driving signal) is invalid, the comparison signal $S_{CP}$ is switched to the low level.

Moreover, the microcontroller 342 determines whether to generate the set signal $S_{PUT}$ according to the comparison signal $S_{CP}$. For example, when the comparison signal $S_{CP}$ is switched to the low level, the microcontroller 342 generates the set signal $S_{PUT}$. Furthermore, the microcontroller 342 accumulates the counter value according to the starting signal STV3 and the clock signals CLK31~CLK34, and generates the first auxiliary signal and the second auxiliary signal according to the counter value. It should be noted that, the shift registers 320_1~320_M also generates the gate driving signals SGII_1~SGII_M according to the starting signal STV3 and the clock signals CLK31~CLK34, so that the microcontroller 342 can obtain the output timing of the gate driving signals SGII_1~SGII_M at the normal status through the counter value. For example, when the counter value is 1, it represents that the shift register 320_1 should output the gate driving signal SGII_1; when the counter value is 2, it represents that the shift register 320_2 should output the gate driving signal SGII_2, and so on. As a result, when the shift register 320_2 can not output the valid gate driving signal SGII_2 because it is damaged, the microcontroller 342 can obtain the information related to the damaged shift register 320_2 through the comparison signal $S_{CP}$. Meanwhile, the microcontroller 342 generates the first auxiliary signal S31 and the second auxiliary signal S32 which are respectively before and after the gate driving signal SGII_2 according to the counter value. In other words, the first auxiliary signal S31 and the second auxiliary signal S32 are synchronous with the gate driving signals SGII_1 and SGII_3 in the normal operation.

Furthermore, for the a repair starting unit 350, the repair starting unit 350 sets a repair starting signal $S_{AT}$ to be valid when receiving the set signal $S_{PUT}$. For example, the repair starting unit 350 includes a diode D51 and an n-type transistor MN1. Herein, the diode D51 is an n-type transistor. The anode end of the diode D51 receives the set signal $S_{PUT}$, and the cathode end of the diode D51 generates the repair starting signal $S_{AT}$. The first end of the n-type transistor MN1 is coupled to the cathode end of the diode D51, and the control end of the n-type transistor MN1 receives the detecting voltage $V_{SEN}$. Moreover, the second end of the n-type transistor MN1 is coupled to a ground.

For the entire operation, when the gate driving signals SGII_1~SGII_M are all valid, i.e. when the detecting voltage $V_{SEN}$ is maintained at the high level, the two ends of the n-type transistor MN1 are conducted, so that the repair starting signal $S_{AT}$ is maintained at the low level. Accordingly, the repair starting signal $S_{AT}$ is invalid in the meanwhile. On the contrary, when one of the gate driving signals SGII_1~SGII_M is invalid, i.e. when the detecting voltage $V_{SEN}$ is maintained at the specific level (the low level), the two ends of the n-type transistor MN1 can not be conducted. Also, the microcontroller 342 outputs the set signal $S_{PUT}$, so that the n-type transistor MN1 is conducted in the meanwhile, thereby generating the valid repair starting signal $S_{AT}$.

In other words, if the shift register 320_2 can not output the valid gate driving signal SGII_2 because it is damaged, the microcontroller 342 can generate the valid repair starting signal $S_{AT}$ to the signal repairing device 360. Meanwhile, the microcontroller 342 generates the first auxiliary signal S31 and the second auxiliary signal S32 which are respectively before and after the gate driving signal SGII_2 according to the counter value. Accordingly, the signal repairing device 360 can be enabled according to the valid repair starting signal $S_{AT}$, and is set according to the first auxiliary signal S31 to generate a repairing signal $S_{RE}$. Furthermore, the signal repairing device 360 stops operating according to the second auxiliary signal S32. It should be noted that, at the same time, the first auxiliary signal S31 and the second auxiliary signal S32 are synchronous with the gate driving signals SGII_1 and SGII_3 in the normal operation. Accordingly, the operation of the signal repairing device 360 is similar to that of the damaged shift register 320_2, and the repairing signal $S_{RE}$ generated by the signal repairing device 360 can replace the invalid gate driving signal SGII_2 through the signal replacing unit 370, thereby achieve the capability of automatically repairing the invalid gate driving signal.

For example, the signal replacing unit 370 includes M switches SW31~SW3M. The first ends of the switches are electrically connected to each other to receive the repairing signal $S_{RE}$. Moreover, the control end of the switch SW31 is coupled to the clock end clk of the shift register 320_1, and the second end of the switch SW31 is coupled to the output end out of the shift register 320_1. Similarly, the control end of the switch SW32 is coupled to the clock end clk of the shift register 320_2, and the second end of the switch SW32 is coupled to the output end out of the shift register 320_2. In such a way, the connection of the switches SW33~SW3M can be obtained. As a result, if the shift register 320_2 can not output the valid gate driving signal SGII_2 because it is damaged, the switch SW32 can be turned on according to the clock signal CLK32, thereby transmitting the repairing signal $S_{RE}$ generated by the signal repairing device 360 to the output end out of the shift register 320_2, and further, replacing the invalid gate driving signal SGII_2.

It should be noted that, when the shift register 320_2 is damaged, the microcontroller 342 generates the first auxiliary signal S31 and the second auxiliary signal S32 related to the gate driving signal SGII_2 according to the counter value, so that the operation of the signal repairing device 360 is similar to that of the damaged shift register 320_2. Furthermore, in the following timing, if the microcontroller 342 further obtains the information related to the damaged shift register 320_4, the microcontroller 342 generates the first auxiliary signal S31 and the second auxiliary signal S32 related to the gate driving signal SGII_4 according to the counter value, so that the operation of the signal repairing device 360 is similar to that of the damaged shift register 320_4. In other words, no matter one or more than one of the shift registers 320_1~320_M are damaged, the signal repairing device 360 can sequentially generate a corresponding repairing signal $S_{RE}$ to replace the invalid gate driving signal.

To sum up, the control unit accumulates the counter value according to the starting signal and the clock signals in an embodiment of the invention, thereby generating the first auxiliary signal and the second auxiliary signal which are respectively before and after the invalid gate driving signal (the specific driving signal). Accordingly, the signal repairing device can generate the repairing signal configured to replace the invalid gate driving signal (the specific driving signal) according to the first auxiliary signal and the second auxiliary signal. As a result, the gate driving circuit has the capability of automatically repairing the invalid gate driving signal in an embodiment of the invention. Therefore, it is not required for the display in the embodiment of the invention to go back to the original manufacturer for reparation because the shift register is damaged, thereby saving the labor cost and effectively increasing the lifespan of the display.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A gate driving circuit, comprising:
    M shift registers, configured to sequentially shift a starting signal to generate M gate driving signals according to a plurality of clock signals, wherein M is a positive integer;
    a detecting unit, configured to switch a detecting voltage to a specific level when a specific driving signal among the gate driving signals is invalid;
    a control unit, configured to accumulate a counter value according to the starting signal and the clock signals, generate a set signal when the control unit receives the detecting voltage having the specific level, and generate a first auxiliary signal and a second auxiliary signal according to the counter value, wherein the first auxiliary signal and the second auxiliary signal are synchronous with two gate driving signals which are before and after the specific driving signal;
    a repair starting unit, configured to set a repair starting signal to be valid when the repair starting unit receives the set signal;
    a signal repairing device, enabled according to the valid repair starting signal, the signal repairing device set to generate a repairing signal according to the first auxiliary signal, and the signal repairing device stopping operating according to the second auxiliary signal; and
    a signal replacing unit, configured to replace the specific driving signal with the repairing signal according to the clock signals.

2. The gate driving circuit as claimed in claim 1, wherein each of the shift registers has a clock end and an output end respectively to receive the clock signals and output the gate driving signals, the $i^{th}$ shift register is set according to the $(i-1)^{th}$ gate driving signal and generates the $i^{th}$ gate driving signal according to the clock signal received by the clock end of the $i^{th}$ shift register, and the $i^{th}$ shift register stops operating according to the $(i+1)^{th}$ gate driving signal, wherein i is an integer and $2 \leq i \leq (M-1)$.

3. The gate driving circuit as claimed in claim 2, wherein the signal replacing unit comprises:
    M switches, wherein first ends of the switches are electrically connected to each other to receive the repairing signal, a control end of the $j^{th}$ switch is coupled to the clock end of the $j^{th}$ shift register, and a second end of the $j^{th}$ switch is coupled to the output end of the $j^{th}$ shift register, wherein j is an integer and $1 \leq j \leq M$.

4. The gate driving circuit as claimed in claim 1, wherein the detecting unit comprises:
    M diodes, wherein an anode end of the $j^{th}$ diode is configured to receive the $j^{th}$ gate driving signal, and cathode ends of each of the diodes are electrically connected to each other to generate the detecting voltage, wherein j is an integer and $1 \leq j \leq M$.

5. The gate driving circuit as claimed in claim 1, wherein the control unit comprises:
    a comparator, having a first input end configured to receive a reference voltage and a second input end configured to receive the detecting voltage and generating a comparison signal accordingly; and
    a microcontroller, configured to determine whether to generate the set signal according to the comparison signal and accumulating the counter value according to the starting signal and the clock signals, wherein the microcontroller generates the reference voltage and generates the first auxiliary signal and the second auxiliary signal according to the counter value.

6. The gate driving circuit as claimed in claim 1, wherein the repair starting unit comprises:
    a first diode, having an anode end configured to receive the set signal and a cathode end configured to generate the repair starting signal; and
    an n-type transistor, having a first end coupled to the cathode end of the first diode, a second end coupled to a ground, and a control end configured to receive the detecting voltage.

7. A display, comprising:
    a display panel, comprising a pixel array, wherein the pixel array is disposed on a substrate; and
    a gate driving circuit, configured to drive the pixel array, and the gate driving circuit comprising:
        M shift registers, disposed on the substrate, and the shift registers configured to sequentially shift a starting signal to generate M gate driving signals according to a plurality of clock signals, wherein M is a positive integer;
        a detecting unit, disposed on the substrate, and the detecting unit configured to switch a detecting voltage to a specific level when a specific driving signal among the gate driving signals is invalid;
        a control unit, configured to accumulate a counter value according to the starting signal and the clock signals, generate a set signal when the control unit receives the detecting voltage having the specific level, and generate a first auxiliary signal and a second auxiliary signal according to the counter value, wherein the first auxiliary signal and the second auxiliary signal are synchronous with two gate driving signals which are before and after the specific driving signal;
        a repair starting unit, disposed on the substrate and configured to set a repair starting signal to be valid when the repair starting unit receives the set signal;
        a signal repairing device, disposed on the substrate, enabled according to the valid repair starting signal, set to generate a repairing signal according to the first auxiliary signal, and stopping operating according to the second auxiliary signal; and a signal replacing unit, disposed on the substrate and configured to replace the specific driving signal with the repairing signal according to the clock signals.

8. The display as claimed in claim 7, wherein each of the shift registers has a clock end and an output end respectively to receive the clock signals and output the gate driving signals, the $i^{th}$ shift register is set according to the $(i-1)^{th}$ gate driving signal and generates the $i^{th}$ gate driving signal according to the clock signal received by the clock end of the $i^{th}$ shift register, and the $i^{th}$ shift register stops operating according to the $(i+1)^{th}$ gate driving signal, wherein i is an integer and $2 \leq i \leq (M-1)$.

9. The display as claimed in claim 8, wherein the signal replacing unit comprises:

M switches, wherein first ends of the switches are electrically connected to each other to receive the repairing signal, a control end of the $j^{th}$ switch is coupled to the clock end of the $j^{th}$ shift register, and a second end of the $j^{th}$ switch is coupled to the output end of the $j^{th}$ shift register, wherein j is an integer and $1 \leq j \leq M$.

10. The display as claimed in claim 7, wherein the detecting unit comprises:

M diodes, wherein an anode end of the $j^{th}$ diode is configured to receive the $j^{th}$ gate driving signal, and cathode ends of each of the diodes are electrically connected to each other to generate the detecting voltage, wherein j is an integer and $1 \leq j \leq M$.

11. The display as claimed in claim 7, wherein the control unit comprises:

a comparator, having a first input end configured to receive a reference voltage and a second input end configured to receive the detecting voltage and generating a comparison signal accordingly; and a microcontroller, configured to determine whether to generate the set signal according to the comparison signal and accumulating the counter value according to the starting signal and the clock signals, wherein the microcontroller generates the reference voltage and generates the first auxiliary signal and the second auxiliary signal according to the counter value.

12. The display as claimed in claim 7, wherein the control unit comprises:

a first diode, having an anode end configured to receive the set signal and a cathode end configured to generate the repair starting signal; and an n-type transistor, having a first end coupled to the cathode end of the first diode, a second end coupled to a ground, and a control end configured to receive the detecting voltage.

* * * * *